US006716046B2

(12) United States Patent
Mistry (10) Patent No.: US 6,716,046 B2
(45) Date of Patent: Apr. 6, 2004

(54) FIELD EFFECT TRANSISTOR STRUCTURE WITH SELF-ALIGNED RAISED SOURCE/ DRAIN EXTENSIONS

(75) Inventor: Kaizad R. Mistry, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/209,554

(22) Filed: Jul. 30, 2002

(65) Prior Publication Data

US 2003/0052333 A1 Mar. 20, 2003

Related U.S. Application Data

(62) Division of application No. 09/473,394, filed on Dec. 28, 1999.

(51) Int. Cl.[7] .................. H01L 21/336; H01L 21/8236; H01L 21/3205
(52) U.S. Cl. ........................ 439/270; 438/278; 438/585; 438/587
(58) Field of Search ................................ 438/589, 587, 438/270, 278

(56) References Cited

U.S. PATENT DOCUMENTS

| 5,338,703 | A | * | 8/1994 | Matsuoka | 438/577 |
|---|---|---|---|---|---|
| 5,434,093 | A | | 7/1995 | Chau et al. | 438/300 |
| 5,448,094 | A | | 9/1995 | Hsu | 257/330 |
| 5,567,966 | A | | 10/1996 | Hwang | 257/347 |
| 5,712,503 | A | | 1/1998 | Kim et al. | 257/345 |
| 5,905,285 | A | | 5/1999 | Gardner et al. | 257/344 |
| 5,998,835 | A | | 12/1999 | Furukawa et al. | 257/330 |
| 6,051,469 | A | | 4/2000 | Sheu et al. | 438/270 |
| 6,117,712 | A | * | 9/2000 | Wu | 438/163 |
| 6,133,606 | A | | 10/2000 | Tung | 257/332 |
| 6,197,642 | B1 | * | 3/2001 | Yeh et al. | 438/270 |
| 6,303,448 | B1 | | 10/2001 | Chang et al. | 438/300 |
| 6,313,043 | B1 | * | 11/2001 | Hattori | 438/745 |

* cited by examiner

Primary Examiner—W. David Coleman
Assistant Examiner—William M. Brewster
(74) Attorney, Agent, or Firm—Blakely, Sokoloff, Taylor & Zafman LLP (57) ABSTRACT

Field effect transistor structures include a channel region formed in a recessed portion of a substrate. The recessed channel portion permits the use of relatively thicker source/drain regions thereby providing lower source/drain extension resistivity while maintaining the physical separation needed to overcome various short channel effects. The surface of the recessed channel portion may be of a rectangular, polygonal, or curvilinear shape. In a further aspect of the present invention, transistors are manufactured by a process in which a damascene layer is patterned, the channel region is recessed by etch that is self-aligned to the patterned damascene layer, and the gate electrode is formed by depositing a material over the channel region and patterned damascene layer, polishing off the excess gate electrode material and removing the damascene layer.

12 Claims, 10 Drawing Sheets

FIELD EFFECT TRANSISTOR STRUCTURE WITH SELF-ALIGNED RAISED SOURCE/ DRAIN EXTENSIONS

The present application is a divisional of application Ser. No. 09/473,394, filed Dec. 28,1999, entitled FIELD EFFECT TRANSASISTOR STRUCTURE WITH SELF-ALIGNED RAISED SOURCE DRAIN EXTENSIONS, which is assigned to the same assignee as the present application.

BACKGROUND OF THE INVENTION

1. Field of the Invention

The invention relates to metal-oxide-semiconductor field effect transistors (MOSFETs) and more particularly to transistor structures having self-aligned raised source/drain regions, and methods of making same.

2. Background

The trend of integrating more functions on a single substrate while operating at ever higher frequencies has existed in the semiconductor industry for many years. Advances in both semiconductor process technology and digital system architecture have aided in producing these more highly integrated and faster operating integrated circuits.

The desired result of many recent advances in semiconductor process technology has been to reduce the dimensions of the transistors used to form the individual circuits found on integrated circuits. There are several well-recognized benefits of reducing the size of transistors. In the case of MOSFETs, reducing the channel length provides the capability to deliver a given amount of drive current with a smaller channel width. By reducing the width and length of a FET, the parasitic gate capacitance, which is a function of the area defined by the width and length can be reduced, thereby improving circuit performance. Similarly, reducing the size of transistors is beneficial in that less area is consumed for a given circuit, and this allows more circuits in a given area, or a smaller, less costly chip, or both.

It has also been well known that MOSFETs can not simply be scaled down linearly. That is, as the width and length attributes of a MOSFET are reduced, other parts of the transistor, such as the gate dielectric and the junctions must also be scaled so as to achieve the desired electrical characteristics. Undesirable electrical characteristics in MOSFETs due to improper scaling include coupling of the electric field into the channel region and increased sub-threshold conduction. These effects are sometimes referred to in this field as short channel effects.

A number of methods have been developed to form ever more shallow source/drain junctions for MOSFETs in order to achieve proper scaling. Unfortunately, these very shallow junctions create source/drain extensions that have increased resistivity as compared with deeper source/drain junctions. In longer channel length MOSFETs with deeper source/drain junctions, the source/drain extension resistivity was negligible compared to the on-resistance of the MOSFET itself. However, as MOSFET channel lengths decrease into the deep sub-micron region, the increased source/drain extension resistivity becomes a significant performance limitation.

What is needed is a field effect transistor structure having very short channel length and low source/drain extension resistivity, yet operable to produce high drive currents without suffering from the short channel effects that produce significant levels of off-state current. What is further needed is a method of manufacturing such a structure.

SUMMARY OF THE INVENTION

Briefly, field effect transistor structures include a channel regions formed in a recessed portion of a substrate. The recessed channel portion permits the use of relatively thicker source/drain regions thereby providing lower source/drain extension resistivity while maintaining the physical separation needed to overcome various short channel effects.

In a further aspect of the present invention, the surface of the recessed channel portion may be of a rectangular, polygonal, or curvilinear shape.

DETAILED DESCRIPTION

Overview

In order to continue to scale the MOSFET to smaller dimensions, it is necessary to scale both the lateral dimensions (e.g., gate length) as well as the vertical dimensions (e.g., junction depth). In particular, it is required to reduce the depth of the source/drain extension (SDE) as the dimensions of the MOSFET are scaled down, so as to reduce short channel effects. However, as SDE depth is reduced, the electrical resistance of this region is increased, thereby reducing transistor performance. Additionally, transistor performance is adversely affected by the reduction of SDE depth because current through the transistor needs to spread out from the thin accumulation layer.

Simply increasing the SDE depth, that is, its thickness, addresses the series resistance problem at the expense of having to tolerate short channel effects that are adverse to increased transistor performance. Conventional transistor structure engineering has focused on optimizing the trade-off between SDE depth and transistor performance, rather than trying to re-engineer the relationship between the thickness of the SDE and role of SDE thickness in inducing undesired short channel effects in MOSFETs.

Elevating the SDE region that is outside gate control, using for example, a selective epitaxy process, can reduce the series resistance to a limited extent. However, because the SDE region under the gate, which is where most of the current spreading takes place, is not affected, the benefit of elevating the SDE region outside of gate control is of limited value. The elevated (also referred to as raised) SDE typically creates additional undesired gate-to-drain and gate-to-source overlap capacitance.

Figure 2:
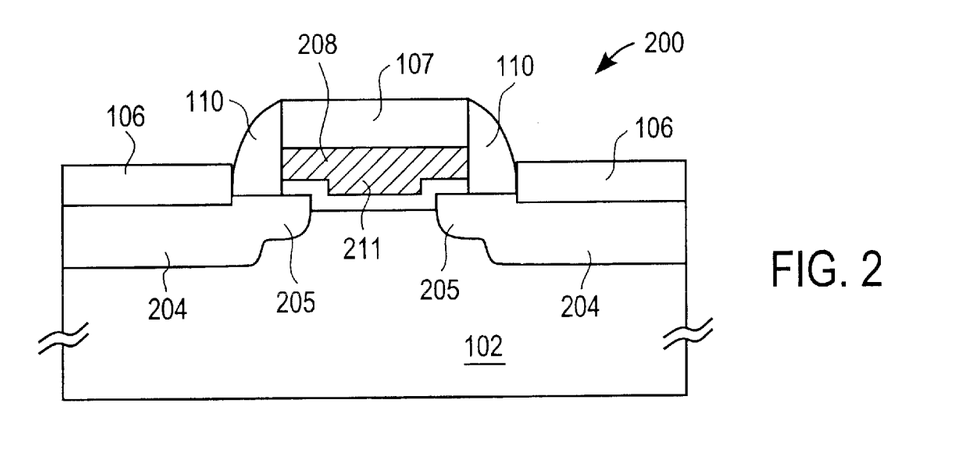
FIG. 2 is a schematic cross-section of a MOSFET having raised source/drain extension in accordance with a first exemplary embodiment of the present invention
Figure 3:
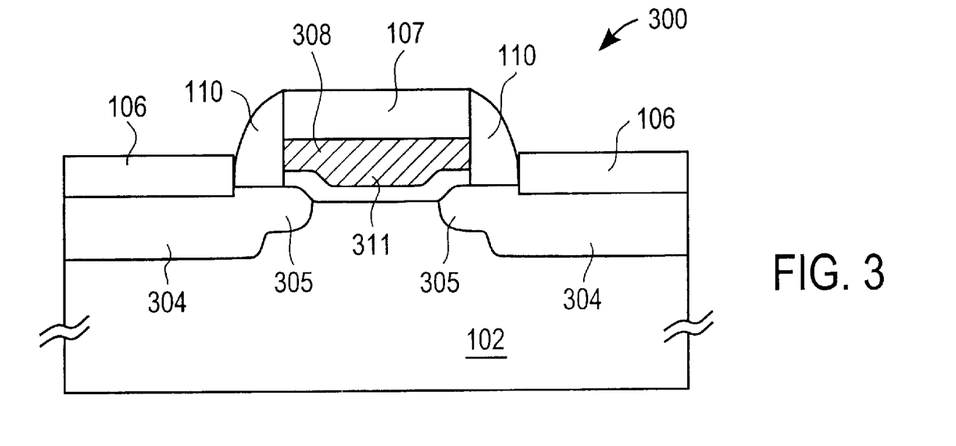
FIG. 3 is a schematic cross-section of a MOSFET in accordance with a second exemplary embodiment of the present invention having tapered edges and raised source/drain extensions.
Figure 4:
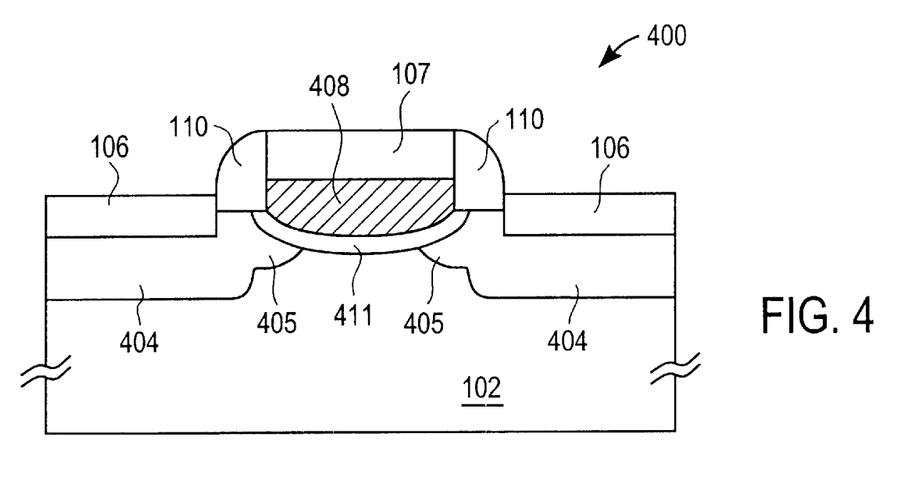
FIG. 4 is a schematic cross-section of a MOSFET in accordance with a third exemplary embodiment of the present invention having a curvilinear gate dielectric and raised source/drain extensions.

MOSFETs in accordance with an exemplary embodiment of the present invention include self-aligned, elevated SDE regions. More particularly, as can be seen in FIGS. 2–4, the SDE regions are elevated with respect to the channel region. Because the elevated SDE regions underlie the gate electrode they are affected by the electric field induced by the charge on the gate electrode. This gate control effectively reduces the series resistance in the SDE regions. The SDEs in MOSFETs that embody the present invention can have increased thickness, relative to conventional MOSFETs, to reduce series resistance because the portion of the SDE that protrudes below the recessed central channel region is shallow, and therefore short channel effects are reduced. Furthermore, because the elevated SDE in accordance with the present invention is self-aligned to the gate electrode, overlap capacitance is reduced relative to conventional raised SDE structures.

Terminology

The terms, chip, integrated circuit, monolithic device, semiconductor device or component, and microelectronic device or component, and similar expressions are often used interchangeably in this field. The present invention is applicable to all the above as they are generally understood in the field.

The term "gate" is context sensitive and can be used in two ways when describing integrated circuits. As used herein, gate refers to the insulated gate terminal, also referred to as a gate electrode, of a three terminal FET when used in the context of transistor circuit configuration, and refers to a circuit for realizing an arbitrary logical function when used in the context of a logic gate. A FET can be viewed as a four terminal device when the semiconductor body is considered.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to in this field as polysilicon, or sometimes more simply as poly.

Source/drain terminals refer to the terminals of a FET, between which conduction occurs under the influence of an electric field, subsequent to the inversion of the semiconductor surface under the influence of an electric field resulting from a voltage applied to the gate terminal. Source/drain terminals are typically formed in a semiconductor substrate and have a conductivity type (i.e., p-type or n-type) that is the opposite of the conductivity type of the substrate. Sometimes, source/drain terminals are referred to as junctions. Generally, the source and drain terminals are fabricated such that they are geometrically symmetrical. Source/drain terminals may include extensions, sometimes referred to as tips, which are shallower than other portions of the source/drain terminals. The tips typically extend toward the channel region of a FET, from the main portion of the source/drain terminal. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

Substrate, as used herein, refers to the physical object that is the basic workpiece that is transformed by various process operations into the desired microelectronic configuration. A substrate may also be referred to as a wafer. Wafers, may be made of semiconducting, non-semiconducting, or combinations of semiconducting and non-semiconducting materials.

The term vertical, as used herein, means substantially perpendicular to the surface of a substrate.

Figure 1:
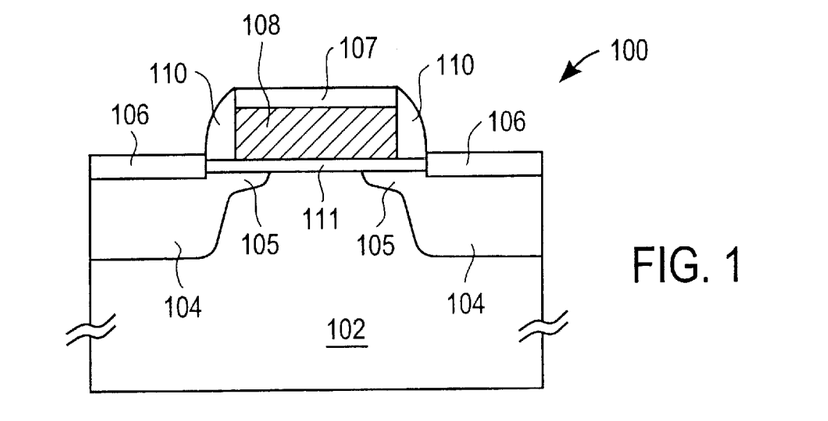
FIG. 1 is a schematic cross-section of a conventional MOSFET showing symmetrical source/drains with source/drain extensions.

A schematic cross-section of a conventional FET is shown in FIG. 1. More particularly, as shown in FIG. 1, a substrate 102 has a gate dielectric layer 111 disposed over the surface thereof, and a patterned gate electrode is formed over gate dielectric layer 104 wherein the gate electrode has a polysilicon portion 108 and a silicided portion 107. As shown, sidewall spacers 110 are disposed along laterally opposed sidewalls of the gate electrode. In this example of a conventional FET, substrate 102 is a silicon wafer, and gate dielectric layer 104 is a silicon dioxide layer.

Structural Examples

FIGS. 2–4 show several illustrations of transistor structures which embody the present invention.

FIG. 2 shows a schematic cross-section of a MOSFET 200 illustrating one embodiment of the present invention. MOSFET 200 includes a gate dielectric 211 disposed over a portion of wafer 102. It can be seen that, unlike the conventional MOSFET of FIG. 1, gate dielectric 211 conforms to a recess in wafer 102. The recess has a bottom portions and substantially vertical sidewalls. A gate electrode is formed over gate dielectric 211, the gate electrode having a polysilicon portion 208 and a silicide portion 107. Sidewall spacers 110, typically silicon nitride, are disposed adjacent the gate electrode. Source/drain extensions 205 are disposed adjacent gate dielectric 211, and deep source/drain regions 204 are disposed substantially wafer 102 in a self-aligned fashion with respect to spacers 110. The spatial relationship between deep source/drain regions 204, source/drain extensions 205 and the channel region underlying gate dielectric 211, are important in providing the electrical advantages of the present invention. By providing transistor 200 with a recessed channel region, source/drain extensions 205 may be elevated with respect thereto. In turn, by elevating source/drain extensions 205, they may be made thicker for reduced electrical resistivity, while appearing to be scaled down in thickness relative to their relationship with the channel region. Also, the innermost portions of source/drain extensions 205, i.e., the portions nearest to the channel region, have a portion of the gate electrode overlying them. This arrangement is also believed to provide improvements in electrical performance.

FIG. 3 shows a schematic cross-section of a MOSFET 300 illustrating an alternative embodiment of the present invention. MOSFET 300 includes a gate dielectric 311 disposed over a portion of wafer 102. It can be seen that, unlike the conventional MOSFET of FIG. 1, gate dielectric 311 conforms to a recess in wafer 102. The recess has a bottom portions and tapered sidewalls. Typically, these tapered sidewalls form an angle greater than 90° with respect to the bottom portion of the recess. A gate electrode is formed over gate dielectric 311, the gate electrode having a polysilicon portion 308 and a silicide portion 107. Sidewall spacers 110, typically silicon nitride, are disposed adjacent the gate electrode. Source/drain extensions 305 are disposed adjacent gate dielectric 311, and deep source/drain regions 304 are disposed substantially wafer 102 in a self-aligned fashion with respect to spacers 110. The spatial relationship between deep source/drain regions 304, source/drain extensions 305 and the channel region underlying gate dielectric 311, are important in providing the electrical advantages of the present invention. By providing transistor 300 with a recessed channel region, source/drain extensions 305 may be elevated with respect thereto. In turn, by elevating source/drain extensions 305, they may be made thicker for reduced electrical resistivity, while appearing to be scaled down in thickness relative to their relationship with the channel region.

FIG. 4 shows a schematic cross-section of a MOSFET 400 illustrating another alternative embodiment of the present invention. MOSFET 400 includes a gate dielectric 411 disposed over a portion of wafer 102. It can be seen that, unlike the conventional MOSFET of FIG. 1, gate dielectric 411 conforms to a recess in the wafer 102. The recess has a curvilinear surface. A gate electrode is formed over gate dielectric 411, the gate electrode having a polysilicon portion 408 and a silicide portion 107. Sidewall spacers 110, typically silicon nitride, are disposed adjacent the gate electrode. Source/drain extensions 405 are disposed adjacent gate dielectric 411, and deep source/drain regions 404 are disposed substantially wafer 102 in a self-aligned fashion with respect to spacers 110. The spatial relationship between deep source/drain regions 404, source/drain extensions 405 and the channel region underlying gate dielectric 411, are important in providing the electrical advantages of the present invention. By providing transistor 400 with a recessed channel region, source/drain extensions 405 may be elevated with respect thereto. In turn, by elevating source/drain extensions 405, they may be made thicker for reduced electrical resistivity, while appearing to be scaled down in thickness relative to their relationship with the channel region.

Many variations are possible within the scope of the present invention. For example, gate dielectric layer 104 is typically a thin layer of oxidized silicon, but the thickness and chemical make-up of gate dielectric layer 104 may be varied within the scope of the invention. Similarly, it will be clear to those skilled in the art, that silicide layers 106, 107 may be formed from various metals, including but not limited to, titanium, tungsten, nickel, cobalt, and molybdenum; and silicide layers 106, 107 are not required to be of the same material or the same thickness. In further alternatives, transistors in accordance with the present invention may be formed without silicide layers, and may further be formed with metal gate electrodes rather than polysilicon gate electrodes. Sidewall spacers 110 are typically formed of silicon nitride, but other suitable materials may be substituted, and the sidewall spacers may be comprised of more than one layer of material. In still further alternatives, the transistor may be formed with silicon germanium source/drain terminals. The foregoing description of alternative materials and structures is for illustrative purposes only, and is not intended as an exhaustive list of alternatives. Those skilled in the art will undoubtedly recognize further variations within the scope of the invention.

Process Examples

Processes embodying the present invention include a damascene transistor flow coupled with a self-aligned channel recess etch. No special equipment, other than that typically used for producing MOS integrated circuits is required. In typical embodiments, channel implant operations are performed on a silicon wafer in a conventional manner, an etch stop layer, typically silicon dioxide, and a damascene layer, typically silicon nitride, are then formed over the wafer. The damascene layer is then patterned using a reverse tone polysilicon (i.e., gate electrode) mask. Alternatively the damascene layer is patterned using the conventional polysilicon mask with a negative photoresist. The patterning of the damascene layer results in openings being formed in areas where the gate electrodes are to be formed. Typically, the etch stop layer at the bottom of the damascene layer opening is removed, and a first spacer may then be formed along the sidewalls of the openings in the damascene layer. These first spacers define regions of the channel that will be recessed. Several alternative processes for recessing the channel are available. For example, in one embodiment an anisotropic etch (e.g., dry etch) of the exposed silicon is performed to recess the transistor channel region. In another embodiment, the exposed silicon is first oxidized, and the oxide is then etched, resulting in a recess with a tapered, rather than vertically abrupt, transition edge. In a further alternative embodiment, the channel recess etch is performed using an isotropic etch (e.g., wet etch) of the exposed silicon, which results in a curvilinear shape for the channel recess. IN relation to the recessed channel, the source/drain extension are elevated.

After the channel recess operation, a gate dielectric, typically an oxide of silicon, is formed over the surface of the channel recess. A material, such as, but not limited to, polysilicon, may then be deposited over the surface of the wafer. A planarization operation, typically chemical mechanical polishing using the damascene layer as an etch stop, is then performed. The damascene and underlying etch stop layers are then removed and source/drain extensions are formed, typically by ion implantation. Spacers are then formed along laterally opposed sidewalls of the gate electrodes. These spacers are often referred to as sidewall spacers. Deep source/drain regions are then formed, aligned to the sidewall spacers, typically by ion implantation.

Further description of illustrative processes embodying the present invention are provided below in connection with FIGS. 5–22.

Figure 5:
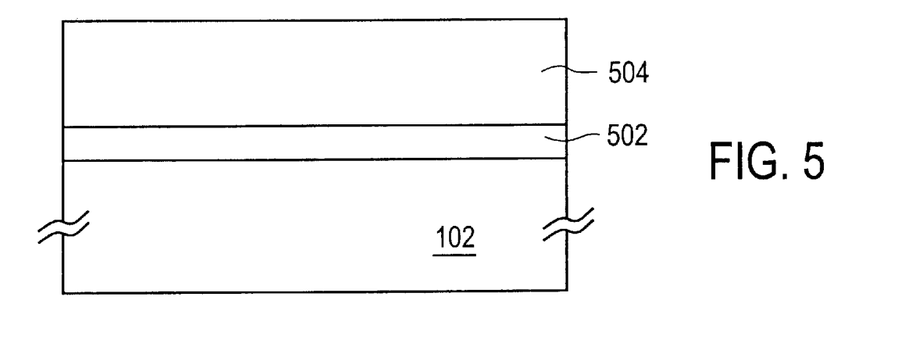
FIG. 5 is a schematic cross-section of a wafer having an etch stop layer and an unpatterned damascene layer formed thereon.

A first process embodying the present invention is described in conjunction with FIGS. 5–12. Referring to FIG. 5, a silicon wafer 102 has an etch stop layer 502 formed thereon. Etch stop layer 502 is typically, but not required to be an oxide of silicon. Etch stop layer 502 may be formed by thermal oxidation of the surface of wafer 102, or by well-known deposition processes. A layer 504, referred to hereinafter as a damascene layer, is formed over etch stop layer 502. Damascene layer 504 is typically a deposited layer of silicon nitride.

Figure 6:
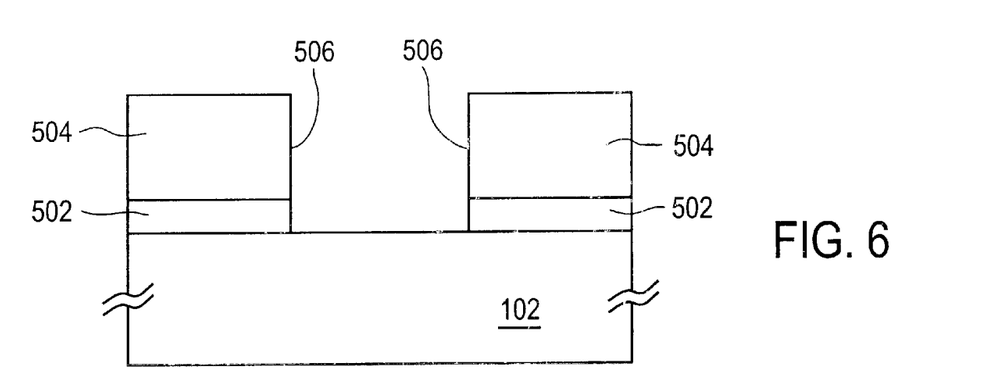
FIG. 6 is a schematic cross-section showing the structure of FIG. 5, after the damascene and etch stop layers have been patterned.

After deposition, damascene layer 504 is patterned, so as to form openings therein. Patterning is typically performed with well-known photolithography processes. The openings in damascene layer 504 have substantially vertical sidewalls, but this is not a requirement of the present invention. These openings correspond to the locations of transistor gate electrodes which are to be formed in a later stage of the process. The openings in damascene layer 504 expose portions of underlying etch stop layer 502. The exposed portions of etch stop layer 502 is removed to expose the underlying silicon wafer 102. FIG. 6 shows the structure of FIG. 5 after the patterning of layers 504 and 502.

Figure 7:
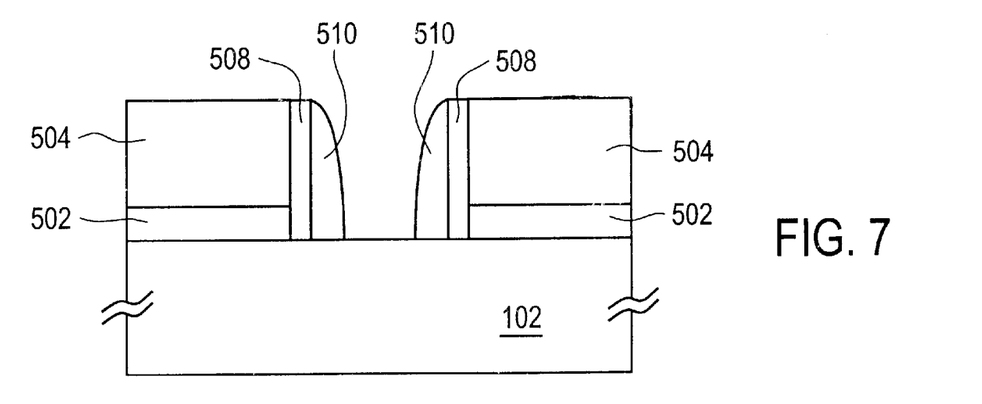
FIG. 7 is a schematic cross-section showing the structure of FIG. 6, after a first spacer layer has been formed adjacent to the sidewalls of the patterned damascene and etch stop layers.

Referring to FIG. 7, the structure of FIG. 6 is shown after two sets of spacers have been formed adjacent the vertical sidewalls of the openings in layers 504, 502. A first spacer 508 is formed immediately adjacent to the sidewalls of the openings and a second spacer 510 is formed adjacent first spacer 508, as shown in FIG. 7. First spacer 508 is typically formed from silicon nitride which has been deposited by CVD and then subjected to an anisotropic etch. Second spacer 510 is typically formed from silicon dioxide which has been deposited by CVD and then subjected to an anisotropic etch.

Figure 8:
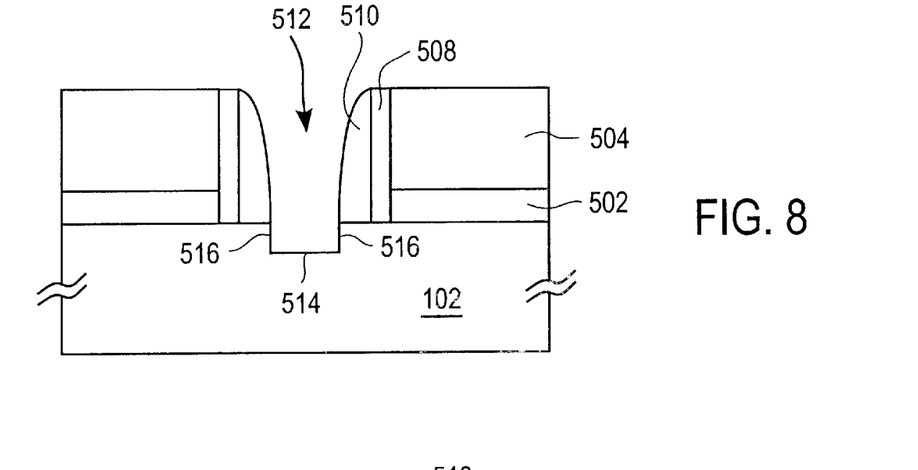
FIG. 8 is a schematic cross-section showing the structure of FIG. 7, after the exposed silicon has been anisotropically etched.

FIG. 8 shows the structure of FIG. 7 after a recess 512 is formed in wafer 102. The recess in the wafer 102 is formed by an anisotropic etch process (e.g., dry etching of silicon). Recess 512 has a bottom portion 514 and substantially vertical sidewalls 516.

Figure 9:
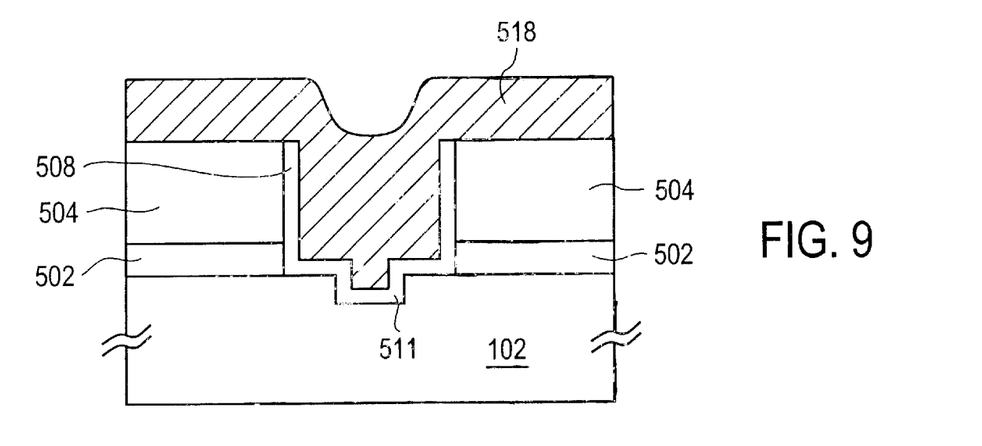
FIG. 9 is a schematic cross-section showing the structure of FIG. 8, after the second spacer has been removed, a gate oxide layer grown over the exposed silicon, and a gate electrode layer deposited over the wafer.

Subsequent to formation of recess 512, second spacer 510 is removed, the exposed silicon surface is oxidized to form a gate dielectric layer 511, and polysilicon 518 is deposited over the surface of wafer 102 as shown in FIG. 9. Those skilled in the art and having the benefit of this disclosure will recognize, that gate dielectric layer 511 may be formed in other ways or with other materials. The thickness and chemical composition of the gate dielectric may vary widely within the scope of the present invention.

Wafer 102 with polysilicon 518 over the surface thereof is planarized, typically by chemical mechanical polishing (CMP). The CMP operation uses damascene layer 504 as a polish stop. The results of the CMP operation, shown in FIG. 10, illustrate newly formed gate electrode 520.

Figure 10:
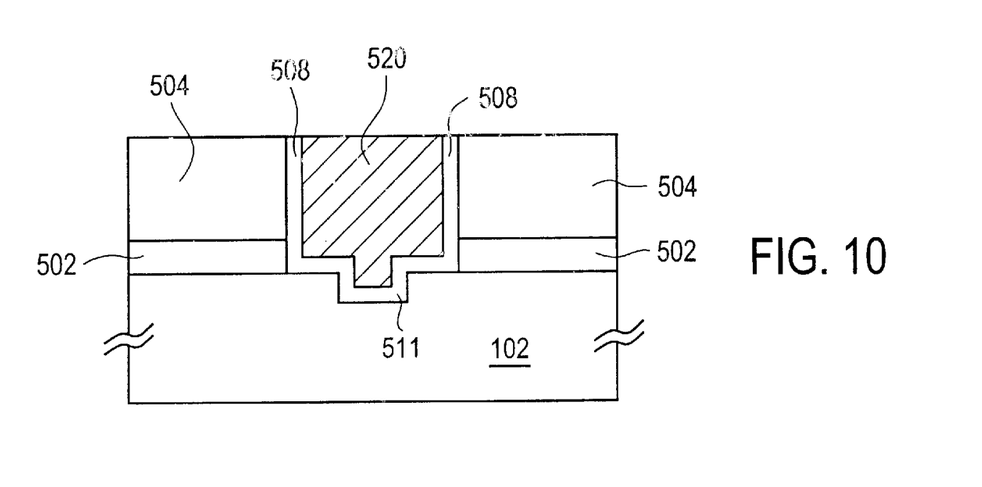
FIG. 10 is a schematic cross-section showing the structure of FIG. 9, after the gate electrode is formed by a chemical mechanical polishing operation which removes the excess gate electrode material.
Figure 11:
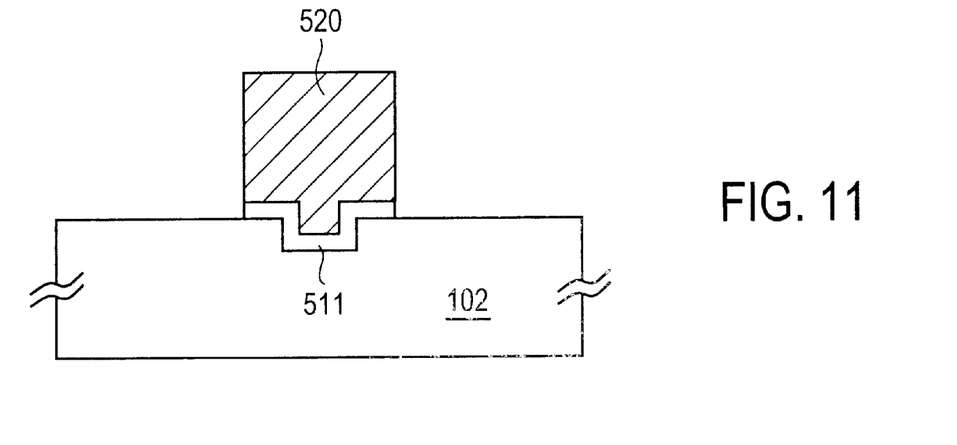
FIG. 11 is a schematic cross-section showing the structure of FIG. 10, after the damascene, first spacer, and etch stop layers have been etched away.

FIG. 11 shows the structure of FIG. 10 after the removal of damascene layer 504, etch stop layer 502, and first spacer 508. More particularly, FIG. 11 shows polysilicon gate electrode 520 disposed superjacent gate dielectric 511, which is formed over the surface of the recessed channel as shown in the figure.

Figure 12:
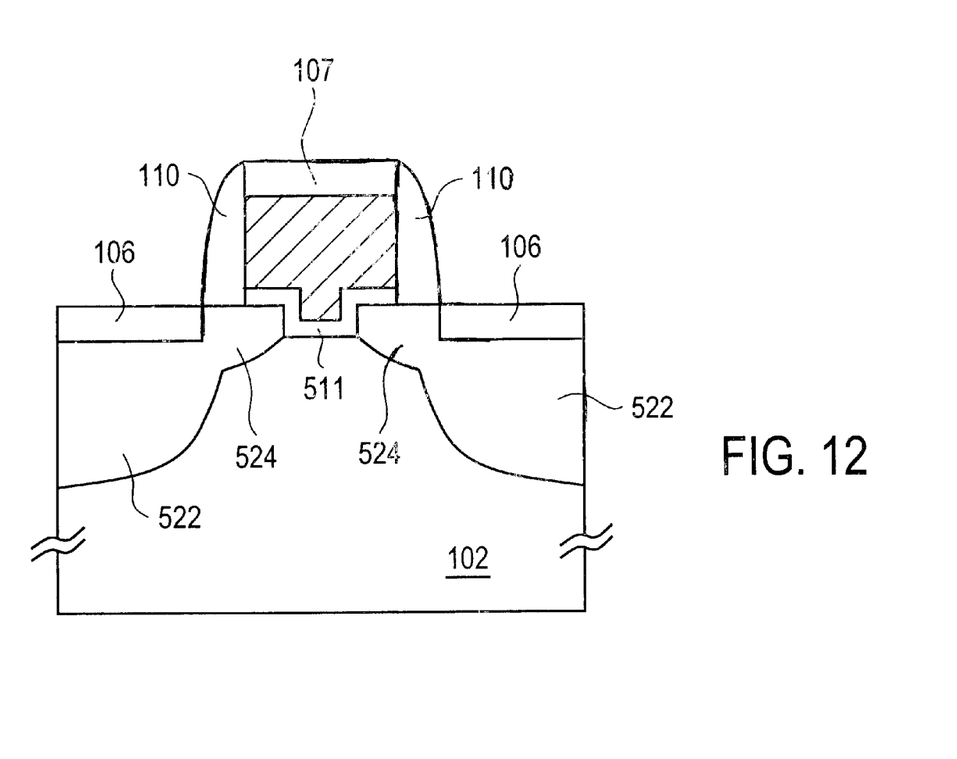
FIG. 12 is a schematic cross-section showing a completed MOSFET formed from the structure of FIG. 11, after conventional processing operations such as source/drain extension implants, gate spacer formation, deep source/drain implants, and silicidation of source/drains and gate electrode.

FIG. 12 shows the structure of FIG. 11, after conventional semiconductor processing operations are used to implant source/drain extensions 524, self-aligned to gate electrode 520, form sidewall spacers 110, implant deep source/drains 522, and form silicide regions 106 and 107.

An alternative embodiment is described in conjunction with FIGS. 5–7 and 13–17. In this alternative illustrative embodiment, the processing operations as described above in connection with FIGS. 5–7 are performed as before. However, referring to FIG. 13, rather than anisotropically etching the exposed silicon surface, the exposed silicon surface is first oxidized, and then the oxidized silicon is removed, resulting in a recess 612 having a bottom portion 614 and tapered sidewalls 616.

Figure 13:
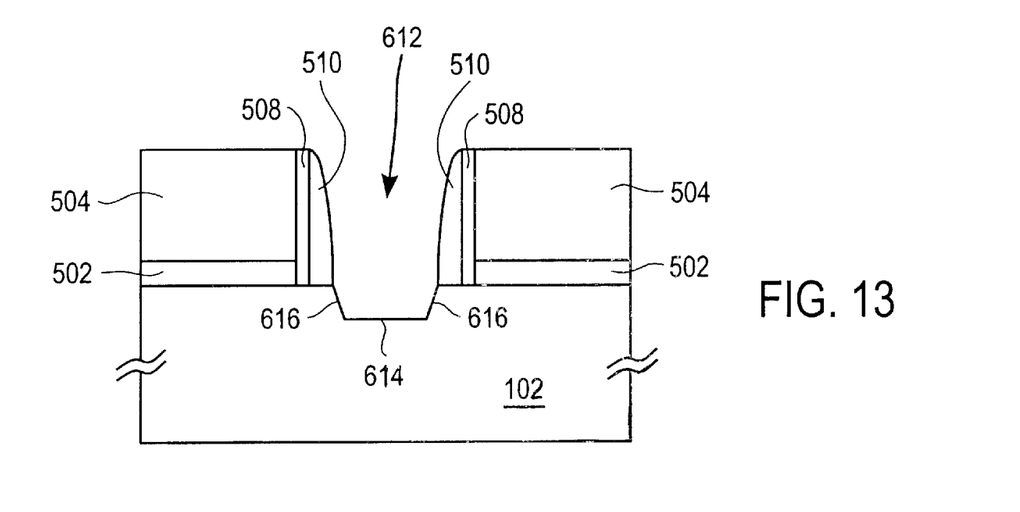
FIG. 13 is a schematic cross-section showing the structure of FIG. 7, after the exposed silicon has been oxidized, and the exposed oxidized silicon has been etched, forming a recess with tapered.
Figure 14:
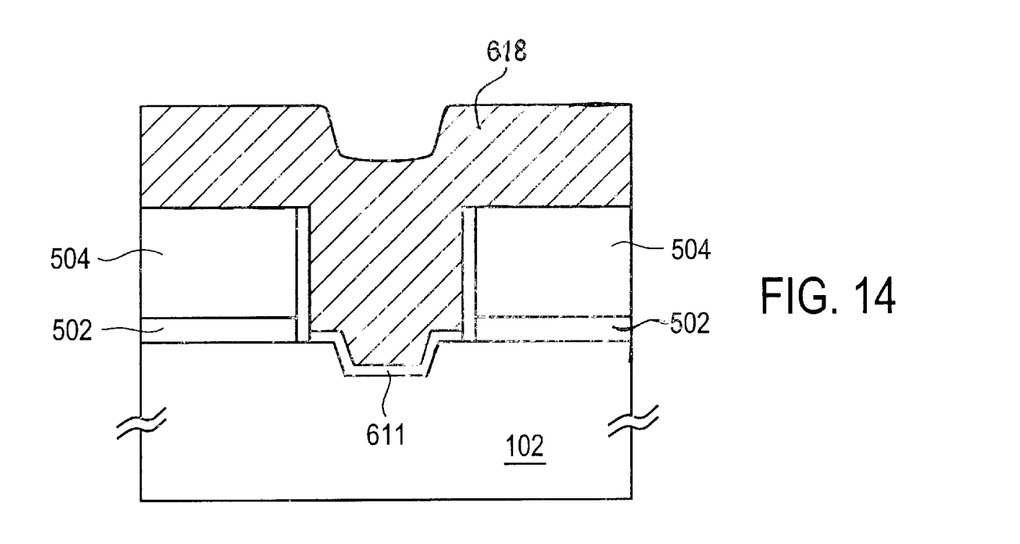
FIG. 14 is a schematic cross-section showing the structure of FIG. 13, after the second spacer has been removed, a gate oxide layer grown over the exposed silicon, and a gate electrode layer deposited over the wafer.

FIG. 14 shows the structure of FIG. 13, after the further processing operations of forming a gate dielectric layer 611 over a bottom portion 614 and tapered sidewalls 616 of recess 612. Gate dielectric 611 is typically formed by oxidizing the exposed silicon surfaces of recess 612. Those skilled in the art and having the benefit of this disclosure will recognize, that gate dielectric layer 611 may be formed in other ways or with other materials. The thickness and chemical composition of the gate dielectric may vary widely within the scope of the present invention.

Figure 15:
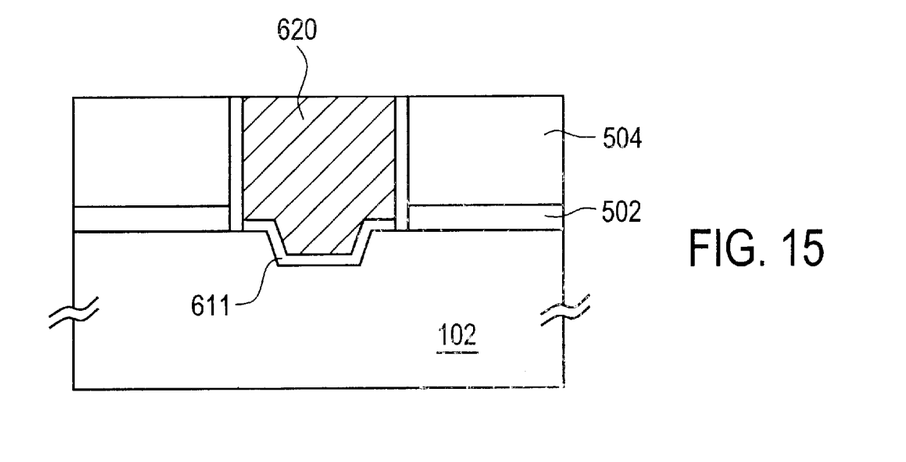
FIG. 15 is a schematic cross-section showing the structure of FIG. 14, after the gate electrode is formed by a chemical mechanical polishing operation which removes the excess gate electrode material.
Figure 16:
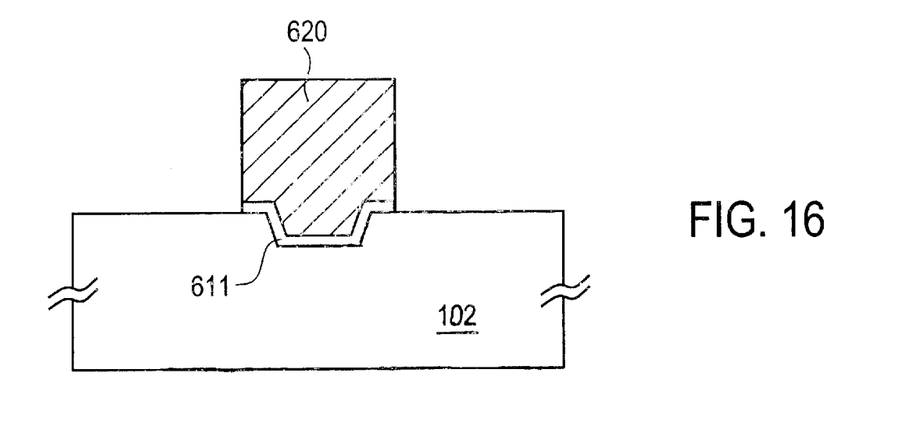
FIG. 16 is a schematic cross-section showing the structure of FIG. 15, after the damascene, first spacer, and etch stop layers have been etched away.

FIG. 15 shows the structure of FIG. 14, after the further processing operations of forming individual gate electrodes 620 by removing the excess polysilicon. Gate electrode 620 is formed from polysilicon 618 by a CMP operation with damascene layer 504 acting as the polish stop layer. CMP of polysilicon is a well-known process operation in this field. FIG. 16 shows the structure of FIG. 15, after damascene layer 504, etch stop layer 502, and first spacer layer 508 are removed by etching. As can be seen, polysilicon gate electrode 620 is disposed superjacent gate dielectric 611, which is formed over the surface of the recessed channel as shown in the figure.

Figure 17:
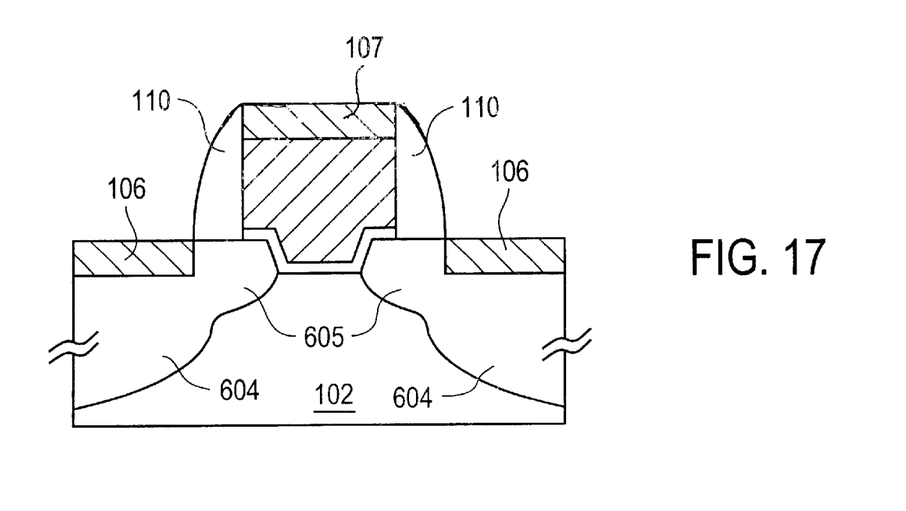
FIG. 17 is a schematic cross-section showing a completed MOSFET formed from the structure of FIG. 16, after conventional processing operations such as source/drain extension implants, gate spacer formation, deep source/drain implants, and silicidation of source/drains and gate electrode.

FIG. 17 shows the structure of FIG. 16, after conventional semiconductor processing operations are used to implant source/drain extensions 624, self-aligned to gate electrode 620, form sidewall spacers 110, implant deep source/drains 622, and form silicide regions 106 and 107.

A further alternative embodiment is described in conjunction with FIGS. 5–7 and 18–22. In this alternative illustrative embodiment, the processing operations as described above in connection with FIGS. 5–7 are performed as before. However, referring to FIG. 18, in this embodiment the exposed silicon surface is isotropically etched, resulting in a recess 712 having a curvilinear surface 714.

Figure 18:
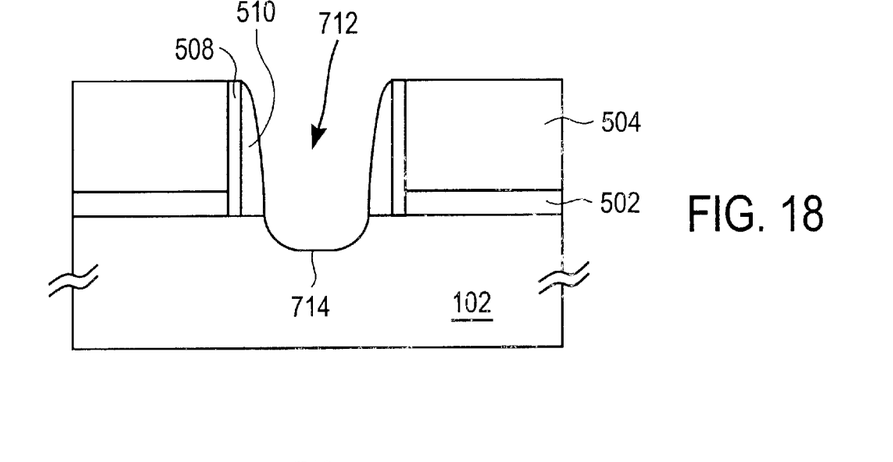
FIG. 18 is a schematic cross-section showing the structure of FIG. 7, after the exposed silicon has been isotropically etched.
Figure 19:
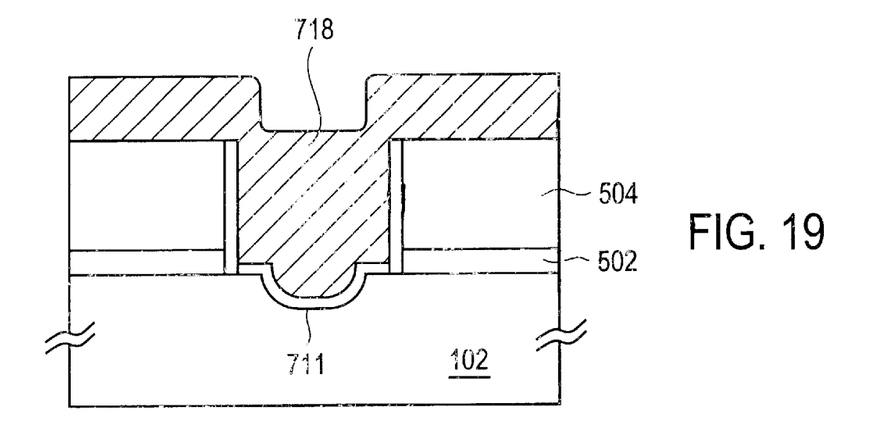
FIG. 19 is a schematic cross-section showing the structure of FIG. 18, after the second spacer has been removed, a gate oxide layer grown over the exposed silicon, and a gate electrode layer deposited over the wafer.

FIG. 19 shows the structure of FIG. 18, after the further processing operations of forming a gate dielectric layer 711 over curvilinear surface 714 of recess 712, the removal of second spacer 510 and the deposition of polysilicon layer 718. Gate dielectric 711 is typically formed by oxidizing the exposed silicon surface of recess 712. Those skilled in the art and having the benefit of this disclosure will recognize, that gate dielectric layer 711 may be formed in other ways or with other materials. The thickness and chemical composition of the gate dielectric may vary widely within the scope of the present invention.

Figure 20:
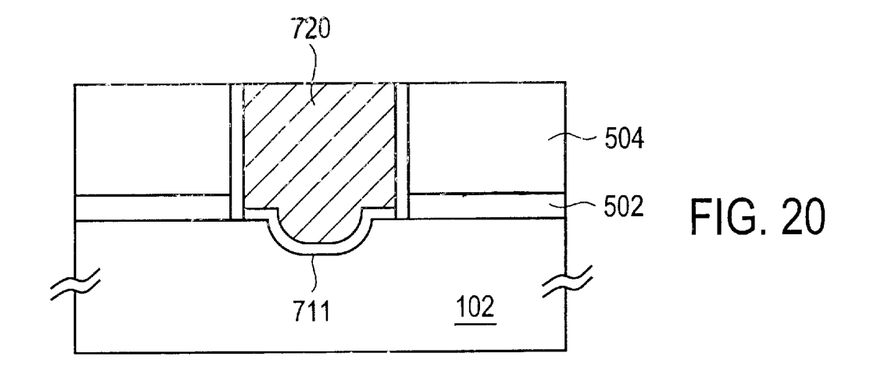
FIG. 20 is a schematic cross-section showing the structure of FIG. 19, after the gate electrode is formed by a chemical mechanical polishing operation which removes the excess gate electrode material.
Figure 21:
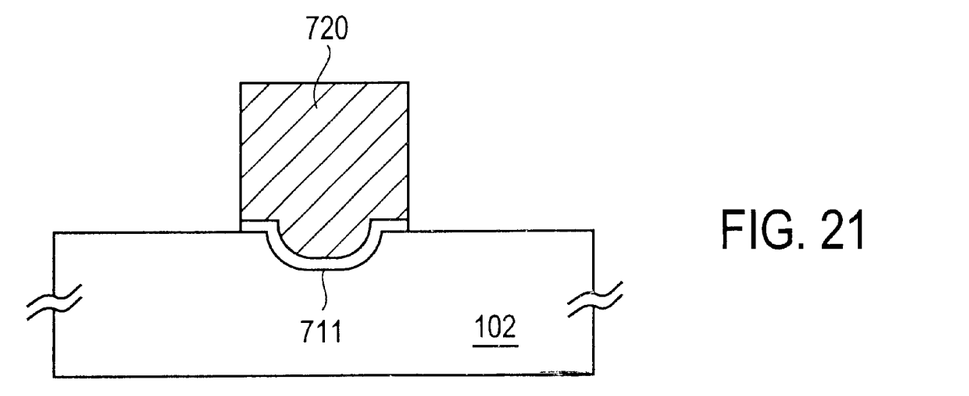
FIG. 21 is a schematic cross-section showing the structure of FIG. 20, after the damascene, first spacer, and etch stop layers have been etched away.

FIG. 20 shows the structure of FIG. 19, after the further processing operations of forming individual gate electrodes 720 by removing the excess polysilicon. Gate electrode 720 is formed from polysilicon 718 by a CMP operation with damascene layer 504 acting as the polish stop layer. CMP of polysilicon is a well-known process operation in this field. FIG. 21 shows the structure of FIG. 20, after damascene layer 504, etch stop layer 502, and first spacer layer 508 are removed by etching. As can be seen, polysilicon gate electrode 720 is disposed superjacent gate dielectric 711, which is formed over the surface of the recessed channel as shown in the figure.

Figure 22:
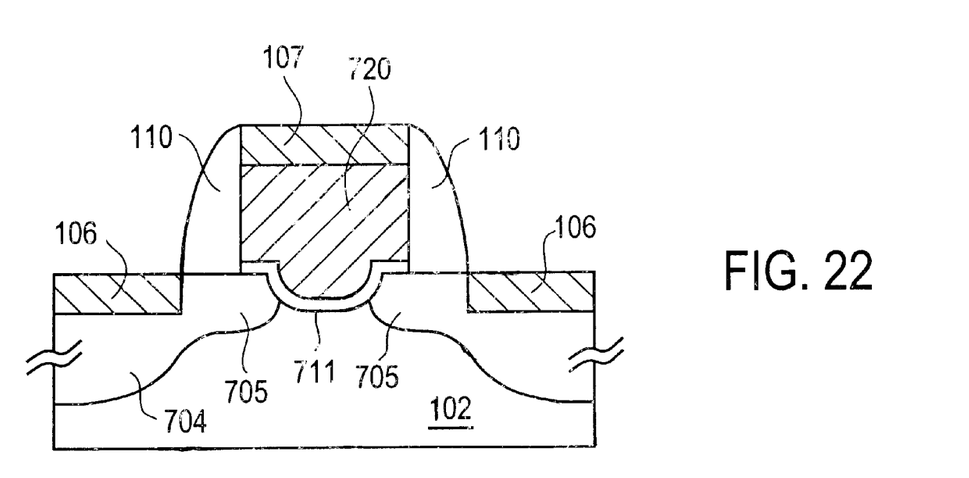
FIG. 22 is a schematic cross-section showing a completed MOSFET formed from the structure of FIG. 21, after conventional processing operations such as source/drain extension implants, gate spacer formation, deep source/drain implants, and silicidation of source/drains and gate electrode.

FIG. 22 shows the structure of FIG. 21, after conventional semiconductor processing operations are used to implant source/drain extensions 705, self-aligned to gate electrode 720, form sidewall spacers 110, implant deep source/drains 704, and form silicide regions 106 and 107.

In a further alternative, channel implants, typically performed prior to the formation of damascene layer 504, are performed after damascene layer 504, and etch stop layer 502 are patterned, and first and second spacers 508, 510 are formed along the sidewalls of the openings in damascene layer 504. As will be understood by those skilled in this field, by having the channel implant self-aligned to the transistor gate, junction capacitance is reduced, and, depending on the actual doping profiles of the channel implant, source/drain extension implant, and deep source/drain implant, counter-doping effects may also be reduced.

Figure 23:
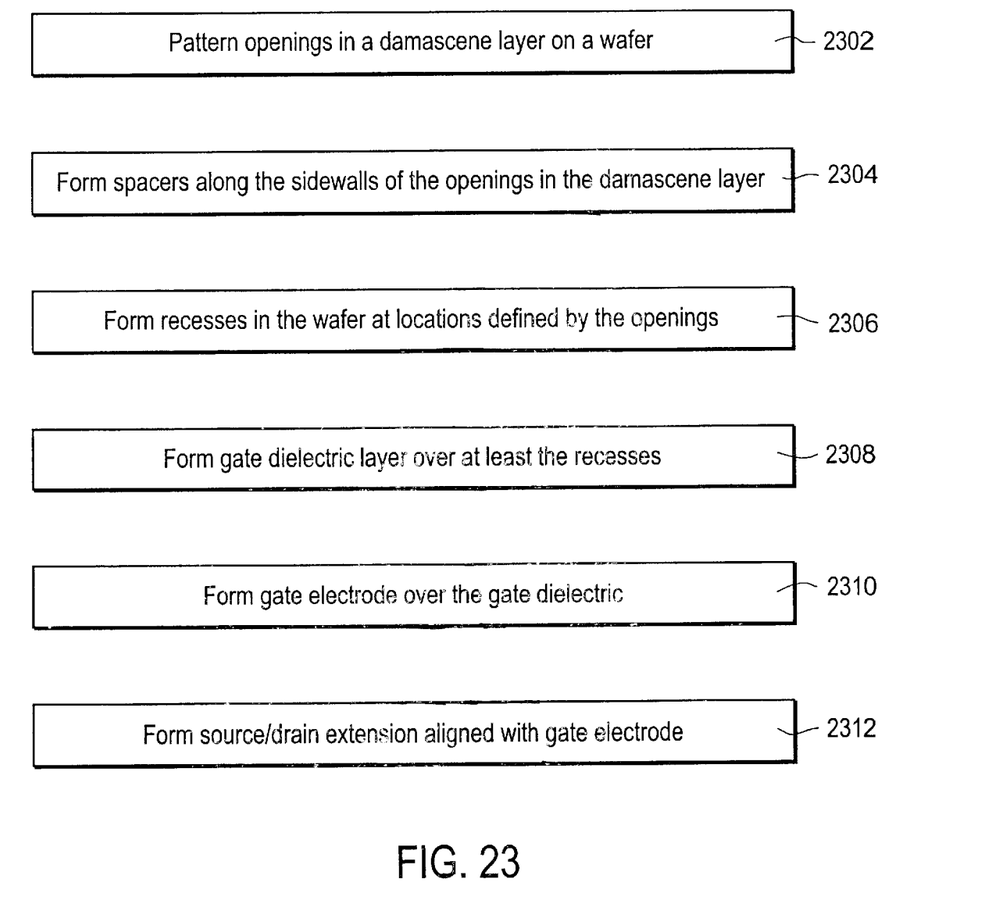
FIG. 23 is a flow diagram of a process in accordance with the present invention.

FIG. 23 is a flow diagram illustrating a process flow in accordance with the present invention. Openings are patterned, typically with conventional lithography techniques, in a damascene layer disposed on a wafer (block 2302). Spacers are then formed along the sidewalls of the openings in the damascene layer (block 2304). Typically a first spacer layer, such as an oxide of silicon, is formed and a second spacer layer, typically a nitride of silicon, is formed adjacent to the first spacer layer. A recess is then formed at the locations defined by the openings (block 2306). The specific shape of the recesses may be varied within the scope of the present invention. For example, recesses may be shaped rectangularly, trapezoidally, curvilinearly, and so on. The various shapes may be achieved by applying corresponding various etch techniques. Isotropic and anisotropic etching are two examples. A gate dielectric is then formed over the recess (block 2308) and a gate electrode is formed over the gate dielectric (block 2310). Source/drain extensions are formed, typically by ion implantation, self-aligned to the gate electrode (block 2312).

Conclusion

Embodiments of the present invention advantageously provide a field effect transistor structure having very short channel length and relatively low source/drain extension resistivity without the adverse short channel effects of conventional MOSFETs having equivalent channel lengths and source/drain extension resistivities. Embodiments of the present invention have source/drain extensions that are elevated relative the channel region of a MOSFET A further advantage of particular embodiments of the present invention is reduced parasitic junction capacitance resulting from performing the channel implant only into portions of the wafer that will become the channel regions of transistors.

Those skilled in the art and having the benefit of this disclosure will recognize that although field oxide regions are not shown in the Figures, the operations and structures shown and described herein, are compatible with various field oxide isolation architectures. Examples of field oxide isolation architectures include shallow trench isolation regions in a surface of a substrate, and the older local oxidation of silicon, which often formed non-planarized oxide isolation regions.

It will be understood by those skilled in the art having the benefit of this disclosure that many design choices are possible within the scope of the present invention. For example, structural parameters, including but not limited to, gate insulator thickness, gate insulator materials, gate electrode thickness, sidewall spacer material, inter-layer dielectric material, isolation trench depth, and S/D and well doping concentrations may all be varied from that shown or described in connection with the illustrative embodiments.

It will be understood that various other changes in the details, materials, and arrangements of the parts and steps which have been described and illustrated may be made by those skilled in the art having the benefit of this disclosure without departing from the principles and scope of the invention as expressed in the subjoined claims.

What is claimed is:

1. A method of making a microelectronic device comprising:

forming a first layer over a substrate;

removing portions of the first layer to expose a portion of the substrate and form substantially vertical sidewalls;

forming a first spacer adjacent the sidewalls;

forming a second spacer adjacent the first spacer;

with the first and second spacers present, etching a recess into the substrate between the spacers, wherein the recess is the first structure formed beneath a surface of the substrate between the spacers;

removing the second spacer;

forming a dielectric layer superjacent the exposed portions of the substrate;

forming an electrode superjacent the dielectric layer; and removing the first layer.

2. The method of claim 1, wherein etching a portion of the exposed substrate comprises isotropically etching the substrate.

3. The method of claim 1, wherein etching a portion of the exposed substrate comprises an isotropically etching the substrate.

4. The method of claim 1, further comprising oxidizing the exposed portions of the substrate, and wherein the etching a portion of the exposed substrate comprises etching the oxidized portions of the substrate.

5. A method of forming a field effect transistor, comprising:

depositing an etch stop layer and a damascene layer over a silicon substrate;

removing portions of the damascene and etch stop layers to expose portions of the silicon, and form sidewalls in the damascene and etch stop layers;

forming a first spacer layer along the sidewalls of the damascene layer and the etch stop layer;

forming a second spacer adjacent the first spacer;

with the first and second spacers present, etching a recess into the substrate between the spacers, wherein the recess is the first structure formed beneath a surface of the substrate between the spacers;

removing the second spacer;

forming a gate dielectric layer superjacent the etched silicon; and depositing a gate electrode layer over the damascene and gate dielectric layers;

planarizing the gate electrode layer so as to form a gate electrode;

removing the damascene layer and etch stop layer; and forming source/drain terminals self-aligned to the gate electrode.

6. The method of claim 5, wherein planarizing the gate electrode layer comprises chemical mechanical polishing using the damascene layer as a polish stop.

7. The method of claim 5, further comprising implanting ions into the silicon substrate.

8. The method of claim 5, further comprising implanting ions into the silicon substrate, after the first and second spacers are formed.

9. The method of claim 5, further comprising performing a channel implant into the silicon using the damascene, first spacer, and second spacer layers as implant masks.

10. The method of claim 5 wherein forming source/drain terminals comprises implanting ions of a first conductivity type into the silicon, adjacent to the gate electrode; forming third spacers adjacent to the gate electrode, and implanting ions of a first conductivity type into the silicon, adjacent to the third spacers.

11. The method of claim 5, wherein etching the silicon comprises an isotropic etch.

12. A method of forming a field effect transistor, comprising:

depositing an etch stop layer and a damascene layer over a silicon substrate;

removing portions of the damascene and etch stop layers to expose portions of the silicon, and form sidewalls in the damascene and etch stop layers;

forming a first spacer layer along the sidewalls of the damascene layer and the etch stop layer, and a second spacer adjacent the first spacer layer;

with the first and second spacers present, etching a recess into the substrate between the spacers, wherein the recess is the first structure formed beneath a surface of the substrate between the spacers;

removing the second spacer;

forming a gate dielectric layer superjacent to the etched silicon;

depositing a gate electrode layer over the damascene and gate dielectric layers;

planarizing the gate electrode layer so as to form a gate electrode;

removing the damascene, second spacer, and etch stop layers; and forming source/drain terminals self-aligned to the gate electrode.

* * * * *